United States Patent [19]
Aoki

[11] Patent Number: 6,142,609
[45] Date of Patent: *Nov. 7, 2000

[54] END PORTION STRUCTURE FOR CONNECTING LEADS OF FLEXIBLE PRINTED CIRCUIT BOARD

[75] Inventor: Nobuo Aoki, Nagoya, Japan

[73] Assignee: Brother Kogyo Kabushiki Kaisha, Nagoya, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/641,547

[22] Filed: May 1, 1996

[30] Foreign Application Priority Data

Aug. 1, 1995 [JP] Japan .................................... 7-216653
Aug. 1, 1995 [JP] Japan .................................... 7-216654

[51] Int. Cl.⁷ ...................................................... B41J 2/14
[52] U.S. Cl. .............................. 347/50; 439/83; 361/777; 361/779
[58] Field of Search ................................ 347/50; 439/83; 361/777, 779

[56] References Cited

U.S. PATENT DOCUMENTS

| | | | |
|---|---|---|---|
| 3,610,811 | 10/1971 | O'Keefe | 174/68.5 |
| 4,942,408 | 7/1990 | Braun | 346/140 R |
| 5,297,007 | 3/1994 | Deyo et al. | 361/707 |
| 5,363,280 | 11/1994 | Chobot et al. | 361/794 |
| 5,604,522 | 2/1997 | Miura et al. | 347/70 |

FOREIGN PATENT DOCUMENTS

4-182138   6/1992   Japan .

*Primary Examiner*—John Barlow
*Assistant Examiner*—Craig A. Hallacher
*Attorney, Agent, or Firm*—Oliff & Berridge, PLC

[57] ABSTRACT

A structure in which a plurality of leads are formed on a base film that are respectively connected to a plurality of terminal portions of a recording head of an ink jet printer by brazing has slits formed among the plurality of leads at this juncture so that gases generated in brazing are discharged from the slits thereby preventing brazing failure due to scattering of molten solder. Further, a slit maybe formed along a center axis of each of the plurality of leads at the juncture so the molten solder flows into the slits. As a result, the connection strength is improved by fillets formed at both sides of the slits. Further, the gases generated in brazing are also evacuated from the open ends of the slits thereby further minimizing brazing failures.

11 Claims, 14 Drawing Sheets

END PORTION STRUCTURE FOR CONNECTING LEADS OF FLEXIBLE PRINTED CIRCUIT BOARD

BACKGROUND OF THE INVENTION

1. Field of the Invention

The invention relates to an end portion structure for connecting leads of a flexible printed circuit board, particularly to an end portion structure for connecting leads of a flexible printed circuit board in which, when a plurality of leads formed on a base film are connected to a plurality of terminal portions of an electronic part of an ink jet printer by brazing, brazing failure can be prevented and insulating performance is promoted.

2. Description of Related Art

Conventionally, in an ink jet printer, recording letters or images on record paper is done by ejecting ink from a plurality of injection nozzles installed on a recording head. A head holder is provided on a carriage movable in a recording direction and an ink jet mechanism comprising a recording head opposed to the record paper and a connecting cylinder (so-called manifold) forming an ink feed path communicating with the recording head is installed at the head holder. An ink cartridge storing ink for feeding to the recording head and provided with an ink feed port for fitting to the connecting cylinder is mounted attachably and detachably thereon.

For example, Japanese Unexamined Patent Publication No. 92-182138 discloses a recording head for an ink jet printer. The ink jet recording head is installed to the ink jet printer and has a central piezoelectric substrate in which a plurality of ink feed paths are formed, ink feed tubes for feeding ink to the respective ink feed paths are formed therein and leads, comprising copper wires, each connected to an electrode mounted to the piezoelectric substrate at the respective ink feed paths. End portions of a plurality of leads, formed on a base film of a flexible printed circuit board, are connected to terminal portions of the plurality of leads formed in the central piezoelectric substrate by brazing, for example, by soldering. The piezoelectric elements are deformed by drive signals supplied via the flexible printed circuit board by which ink is ejected and images are recorded.

Figure 6:
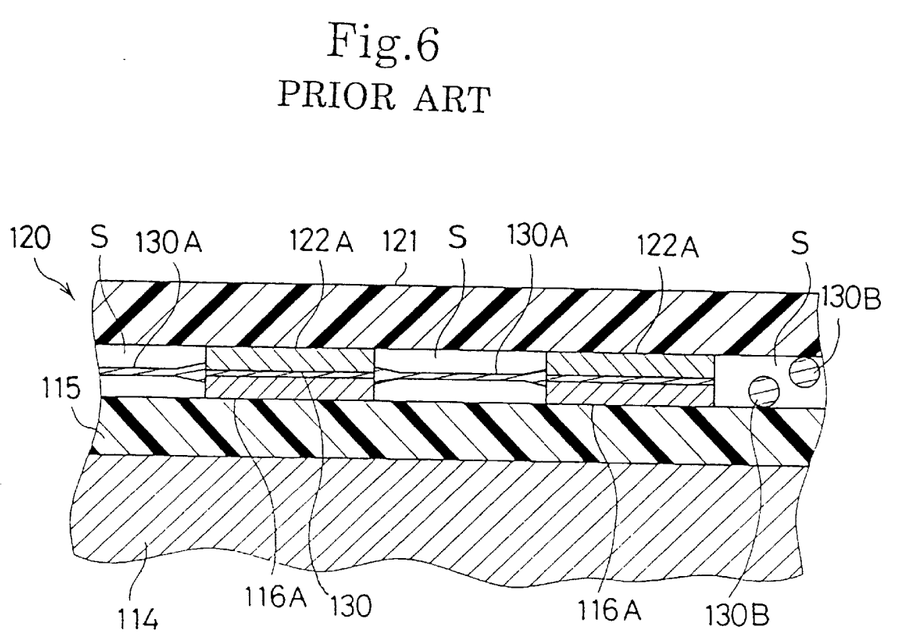
FIG. 6 is a view of a conventional flexible printed circuit board corresponding to FIG. 4.
Figure 7:
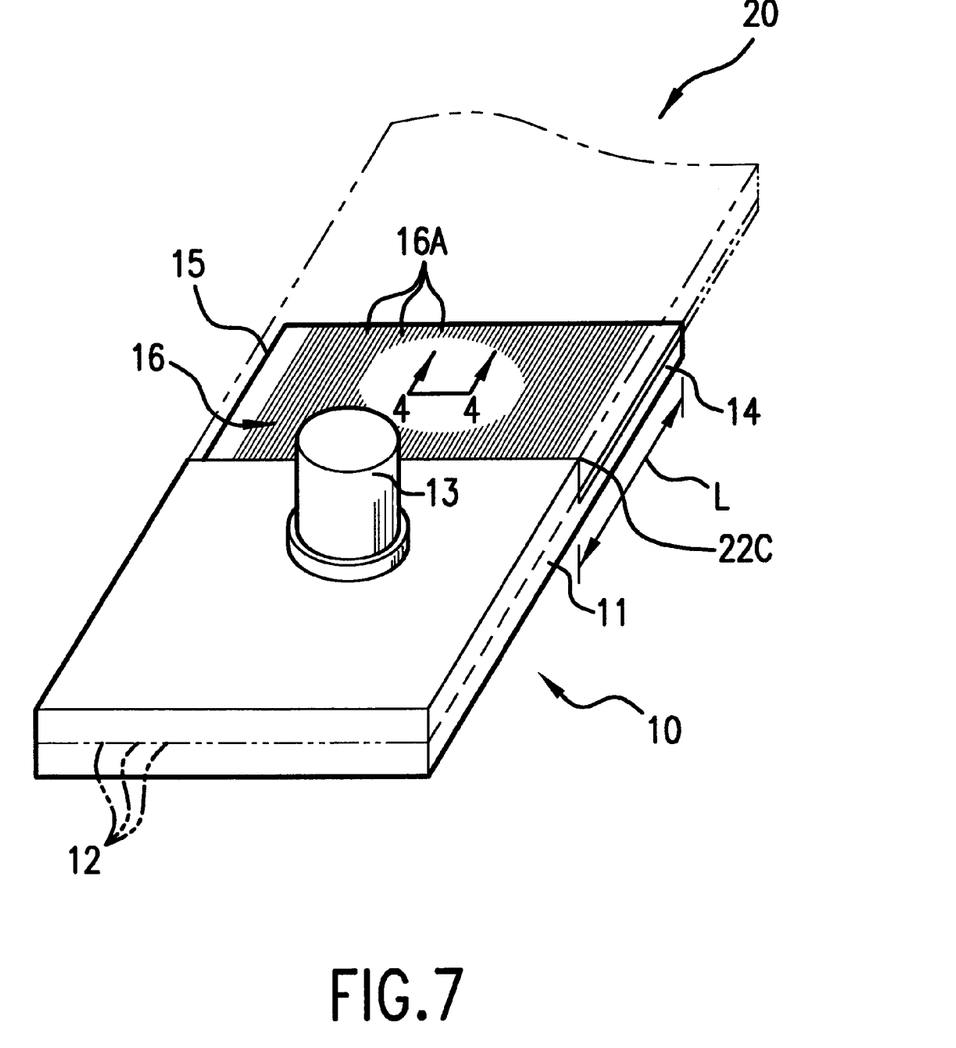
FIG. 7 is a perspective view of the outline structure of a recording head unit according to the alternative configuration of FIG. 4A.
Figure 8:
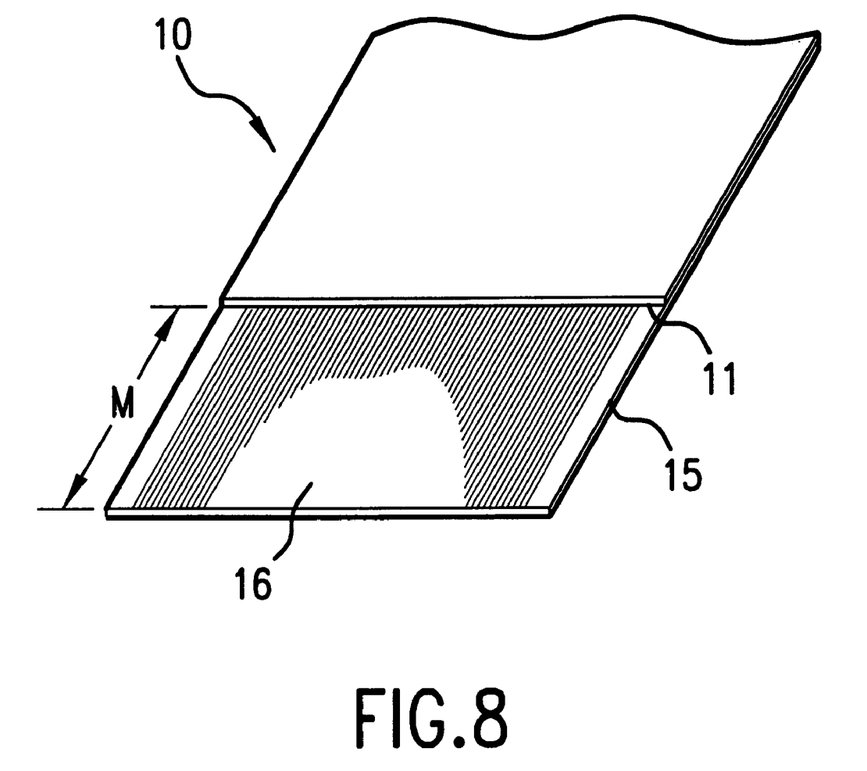
FIG. 8 is a partial perspective view showing an end portion of recording head unit according to the alternative configuration of FIG. 4A.
Figure 9:
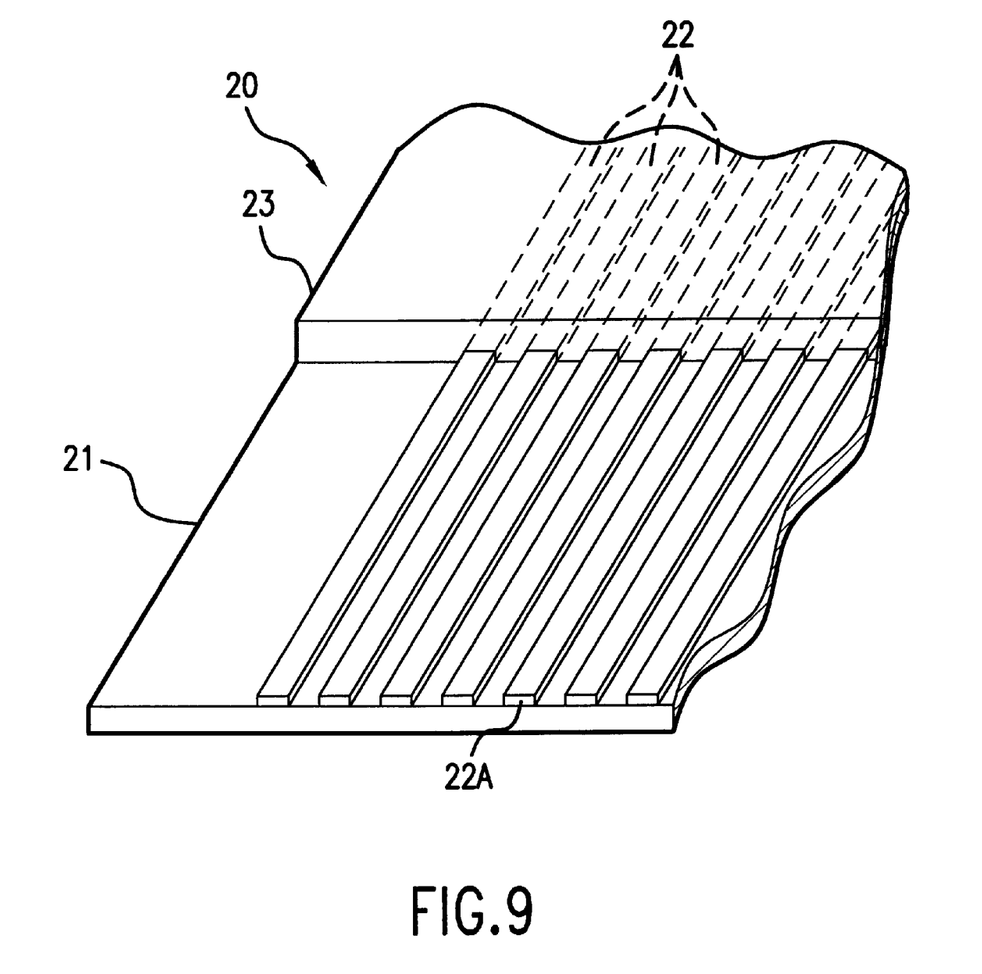
FIG. 9 is an enlarged partial perspective view of the flexible printed circuit board of the alternative configuration of FIG. 4A.
Figure 10:
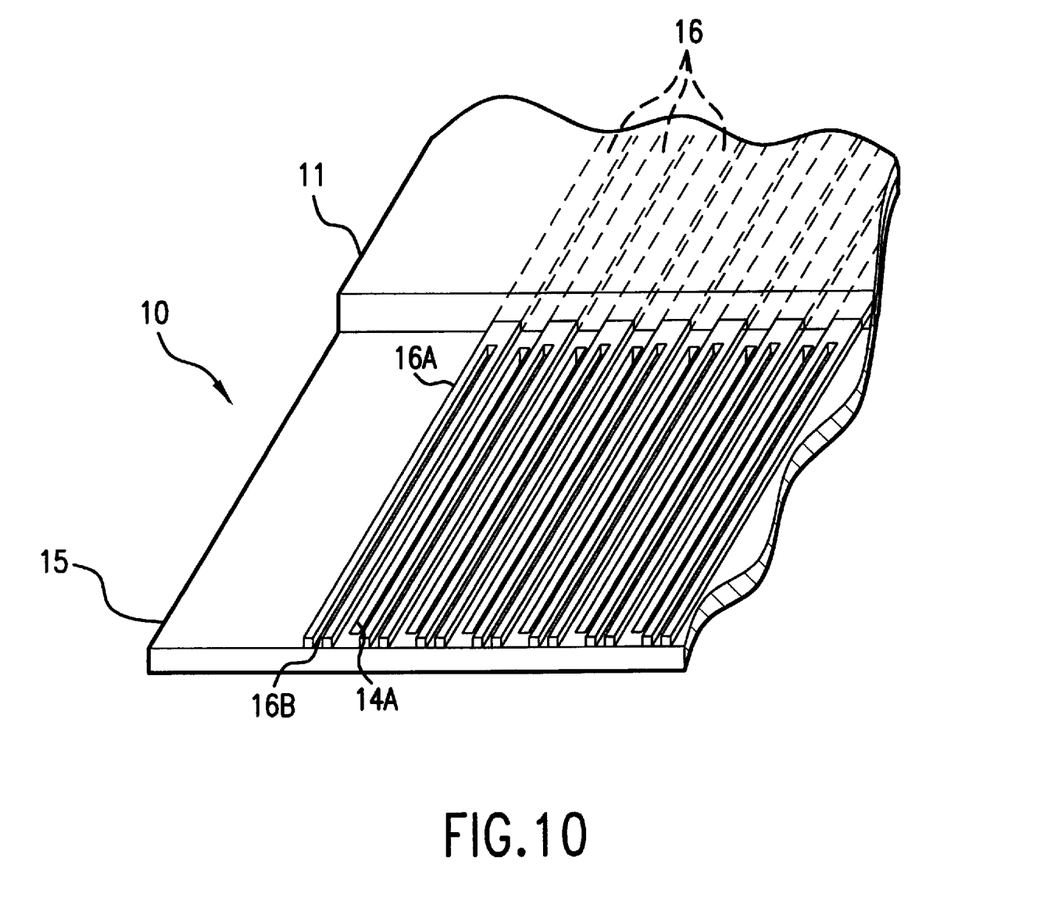
FIG. 10 is an enlarged partial perspective view of the recording head unit of the alternative configuration of FIG. 4A.
Figure 10A:
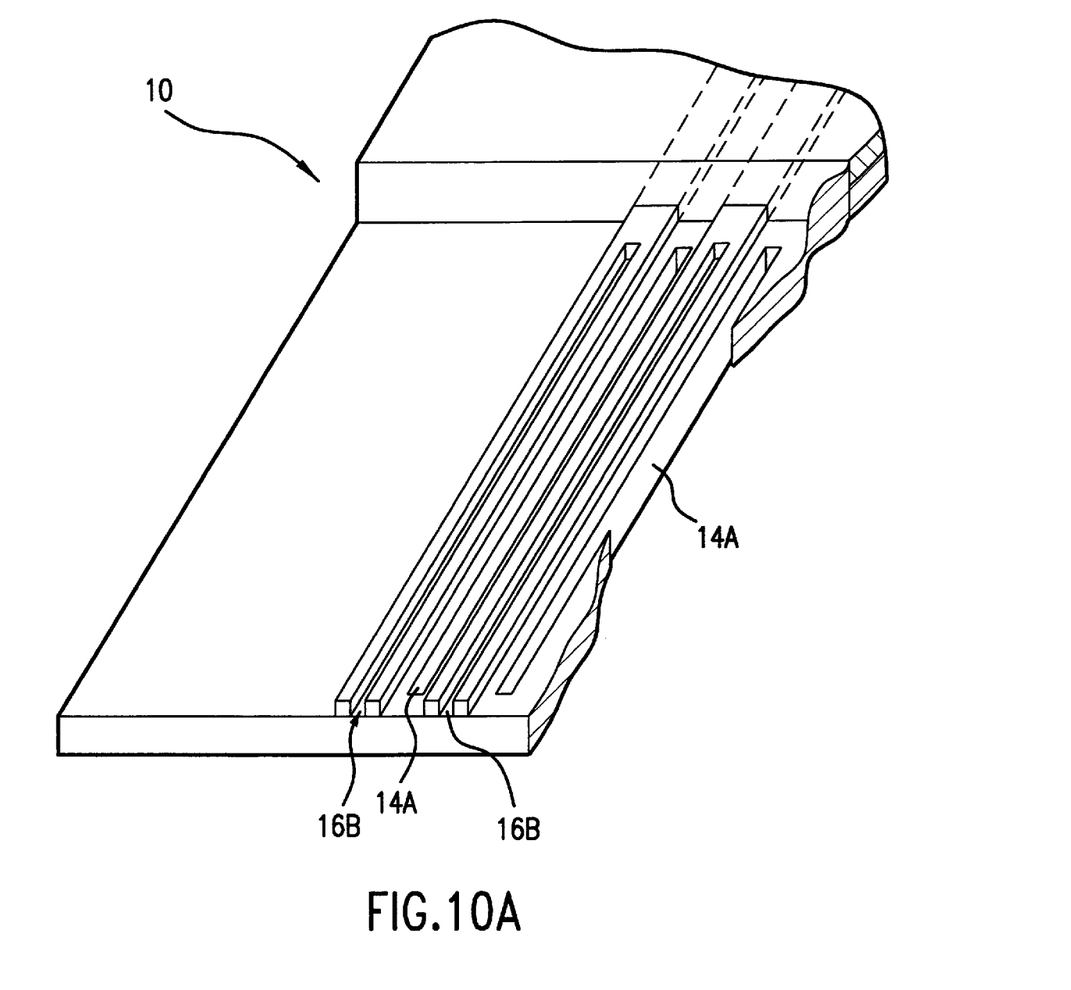
FIG. 10A is a blow up or an expanded portion of FIG. 10 to better show the slits of the recording head unit of the alternative configuration of FIG. 4A.

In the case where the end portions of the plurality of leads of the flexible printed circuit board are connected to the terminal portions of the plurality of leads of the central piezoelectric substrate provided in the recording head by soldering, as shown in FIG. 6, to downsize the recording head a line width and a pitch between leads of the plurality of end portions of leads 122A are rendered as small as, for example, 0.5 mm or less which is defined as a fine pitch. Accordingly, an electrolytically-plated solder 130 is thinly coated on the plurality of end portions of leads 122A. Flux (so-called resin or rosin) promoting the soldering is coated thereon. The flexible printed circuit board 120 is positioned at and mounted on terminal portions 116A of the leads of the central piezoelectric substrate 114 and the plurality of end portions of leads 122A are soldered all at once by pressing and simultaneously heating at a predetermined temperature.

As stated above, in the case where the end portions of the leads formed on the flexible printed circuit board are connected to the terminal portions of the plurality of leads of the central piezoelectric substrate by soldering, as shown in FIG. 6, the electrolytically-plated solder coated on the end portions of leads 122A of the flexible printed circuit board 120 is molten as is the flux. The flux is obtained by dissolving the resin in alcohol and, accordingly, when the flux is heated to high temperatures (for example, approximately 300° C.), gases are generated from the resin and alcohol is explosively evaporated instantaneously.

Because the thickness of each lead is as thin as approximately 18 through 35 $\mu$m and the pitch between leads is defined as a fine pitch and is as small as approximately 0.5 mm or less, a connecting space S surrounded by the two lead connecting portions in each of which the end portion of lead wire 122A and the terminal portion 116A overlap and by the two base films 121 and 115, is very small. Therefore, gas generated by the evaporation of the alcohol or gasses generated from the resin cannot escape to the atmosphere and are confined to the very small connecting portion spaces S. As a result, the gas pressure increases and the plating solder 130 boils. At this moment, the boiled liquid plated solder 130 scatters so that a so-called solder bridge 130A spanning the gap between two adjacent lead connecting portions is formed or a plurality of solder balls 130B are scattered into space S. That is, the two lead end portions 122A are short-circuited by the formed solder bridge 130A or the solder balls 130B which absorb moisture and corrode degrading the insulating performance between the two leads.

SUMMARY OF THE INVENTION

It is an object of the invention to provide an end portion structure for connecting leads of a flexible printed circuit board capable of preventing brazing failure by eliminating solder scattering, promoting insulating performance and also promoting connection strength when end, or end connection portions of a plurality of leads formed on a flexible printed circuit board are connected to a plurality of terminal, or end connection portions of an electric part or an ink jet printer by brazing.

According to an end, or end connection portion structure for connecting leads of a flexible printed circuit board in this invention, a plurality of leads are formed on a base film at a fine pitch, the end portions of the plurality of leads are respectively connected to end, or end connection portions of a plurality of leads of an electric part by brazing and slits, for the evacuation of gas generated in brazing, are respectively formed among the end portions of the plurality of leads, in the base film or the end portions of the electric part.

The end portions of the plurality of leads formed on the base film of the flexible printed circuit board are often connected, especially by soft soldering such as brazing. The solder and flux are coated on the end portions of the plurality of leads. Therefore, in heating the solder, the flux is also heated and gases generated from the heated flux are discharged to the atmosphere via the slits for gas evacuation formed among the end portions of the plurality of leads. Accordingly, the solder melted by heating does not scatter violently or explosively. Consequently, when the end portions of the leads on the flexible circuit board are connected to the end portions of the plurality of leads of the electric part by brazing, brazing failure can be prevented and the insulating performance between leads is improved.

Further, in the above-mentioned end portion structure of a flexible circuit board for connecting leads, the length of each of the above-mentioned slits for gas evacuation is approximately equal to a length of portions for brazing. According to this structure, the length of each slit for gas evacuation is formed approximately equal to the length of the portions of brazing at the end portions of the leads, whereby gas evacuation is sufficiently achieved and scattering of molten solder can be prevented.

Further, according to the above-mentioned end portion structure for connecting leads of the flexible printed circuit board, the above-mentioned respective slit comprises a plurality of slits each having a very small length. According to this structure, each slit for gas evacuation comprises the plurality of slits each having a very small length and accordingly, not only the effect of gas evacuation is provided but tensile strength of the end portion structure for connecting leads of the flexible printed wiring board is enhanced.

Further, according to the end portion structure for connecting leads of the flexible circuit board, a plurality of leads are formed on a base film at a fine pitch. The end portions of the plurality of leads are respectively connected to end portions of a plurality of leads of an electric part wherein a slit located at a central portion, with respect to the width direction of the lead, for storing molten solder in soldering is formed at each of the end portions of the plurality of leads.

The operation is as follows. The end portions of the plurality of leads formed on the base film of the flexible printed circuit board are often connected, especially by soft soldering as brazing. The solder and the flux are coated on the end portions of the plurality of leads. Therefore, the solder and the flux are simultaneously heated during soldering. At this moment extra solder in the molten solder other than that adhered to the connecting faces of the end portions of the leads, flows in and is stored in the slits formed in the leads, forming fillets. As a result, even if gases are generated from the heated flux and confined among the end portions of the leads to thereby enhance the gas pressure, since almost no scattered flux is present at the external sides of the end portions of the leads, not only can brazing failure be prevented, but the connection strength is promoted by the fillets formed at the both sides of the slits.

Further, the above-mentioned respective slits in the above-mentioned end portion structure are formed approximately equal to the length of portions for brazing of the end portions of the leads. According to this structure, the respective slits for storing solder are formed approximately equal to the length of the portions for brazing at the end portions of leads. Accordingly, an effect of storing extra solder is sufficiently achieved and scattering of the solder is prevented.

Further, the above-mentioned respective slits in the end portion structure are formed in an opened state at the end portions of the leads. According to this structure, the respective slits for storing solder are formed in an opened state at the end portions of the leads and, accordingly, the soldering gases generated from the flux are evacuated from the open slits. As a result, the scattering of solder can be better prevented.

As stated above, according to the end portion structure for connecting leads of a flexible printed circuit board of the invention, the slits for gas evacuation in brazing are respectively formed among the end portions of the plurality of leads in the end portion of the base film. Therefore, gases generated in brazing are discharged to the atmosphere via the slits. Accordingly, the solder melted by heating does not scatter violently or explosively. When the end portions of the leads formed on the flexible printed circuit board are connected to the end portions of the plurality of leads of the electric part, brazing failure can be prevented and the insulating performance among leads is improved.

Further, according to the end portion structure for connecting leads of a flexible printed circuit board of the invention, the respective slits for gas evacuation are formed approximately equal to the length of the portions for brazing. Therefore, the effect of gas evacuation can be achieved and the scattering of molten solder can prevented.

Further, according to the end portion structure for connecting leads of a flexible printed circuit board of the invention, each slit for gas evacuation comprises a plurality of slits each having a very small length. Therefore, not only the gas evacuation effect is provided but the tensile strength of the end portion of the flexible printed circuit board for connecting leads can be promoted.

Further, according to the end portion structure for connecting leads of a flexible printed circuit board of the invention, the slits for storing molten solder in brazing are respectively formed at the end portions of the plurality of leads. Accordingly, extra solder, other than the solder adhered to the connecting faces of the end portions of the leads, flows in and is stored in the slits formed in the leads, forming the fillets. Therefore, even if gases are generated in soldering, almost no scattered solder is present at the external sides of the end portions of the leads. As a result, when the end portions of the leads formed on the flexible printed circuit board are connected to the end portions of the plurality of leads of the electric part, not only can brazing failure 5 be prevented but the connection strength is improved by the fillets formed on both sides of the slits.

Further, according to the end portion structure of a flexible printed circuit board for connecting leads of the invention, the respective slits for storing solder are formed approximately equal to the length of the portions for soldering at the end portions of the leads. Therefore, the effect of storing extra solder can sufficiently be achieved and the scattering of solder can firmly be prevented.

Further, according to the end portion structure for connecting leads of a flexible printed circuit board of the invention, the respective slits for storing solder are formed in an open state at the end portions of the leads. Therefore, the soldering gases generated from the flux or the solder evacuate via the slits. Accordingly, the gas evacuation during brazing can be performed and the scattering of solder can be prevented.

BRIEF DESCRIPTION OF THE DRAWINGS

A preferred embodiment of the invention will be described in detail with reference to the following figures wherein:

FIGS. 4 and 4A are sectional front views taken on line 4—4 in FIG. 1;

DETAILED DESCRIPTION OF THE PREFERRED EMBODIMENTS

An explanation will be given of an embodiment of the invention in reference to the drawings. The embodiment describes a case where the invention is applied to an end, or connection portion structure for connecting leads of a flexible printed circuit board, more generally, a flexible electrical connection to a plurality of terminal, or end connection portions of a recording head unit, more generally, an electric part, provided to an ink jet printer (not shown) for ejecting ink, for recording, that is stored in an ink cartridge.

Figure 1:
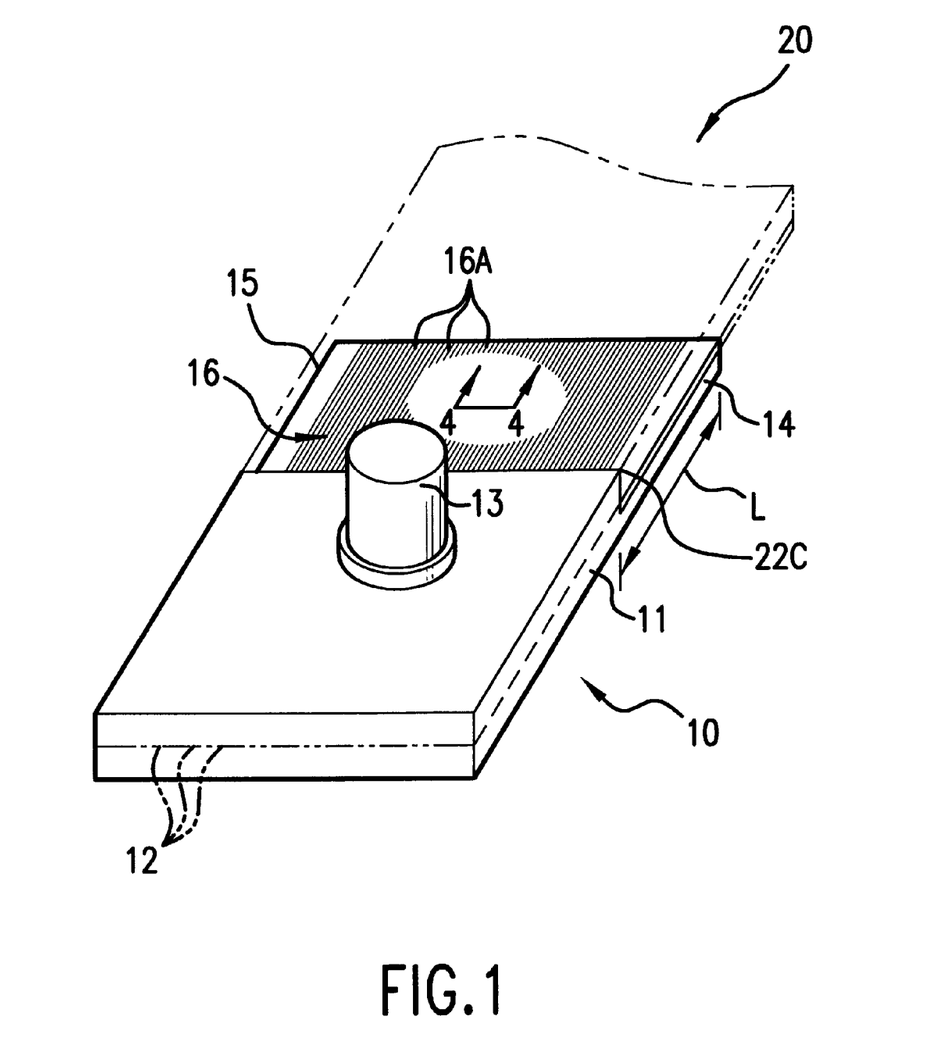
FIG. 1 is a perspective view of the outline structure of a recording head unit according to an embodiment of the invention.

First, an explanation will be given of a recording head unit, or electronic port 10 (corresponding to a recording head of an ink jet printer). As shown in FIG. 1, a plurality (for example, 64) of ink jet nozzles 12 are formed in one row at the front end portion of a plate-like head main body portion 11. A connecting cylinder 13 protrudes from the head main body portion 11. Further, at the rear end portion of the head main portion 11, is a connecting portion 14 having a smaller thickness.

The connecting cylinder 13 is for feeding ink to the ink jet nozzles 12 by inserting it to an ink feed port formed in an ink cartridge (not shown). Ink fed to the connecting cylinder 13 is shunted to a plurality of ink feed paths (not shown) via an ink path (not shown) formed in the connecting cylinder 13 and is fed to the ink jet nozzles 12 via the respective ink feed paths. Further, an oscillating plate comprising a piezoelectric element, not shown, is provided at the midway portion of each of the ink feed paths.

A plurality of leads 16 supply drive signals to the respective piezoelectric elements and are formed on a base film 15 at a fine pitch, as small as 0.5 mm or less, and the plurality of leads 16 are extended approximately in parallel to the connecting portion 14 (shown as length L). That is, each of terminal portions 16A of the plurality of leads 16 provided at the connecting, or connection portion 14 is in an exposed state. A very small amount of ink at the ink feed paths is ejected on to a record paper from the ink jet nozzles 12, by supplying drive signals to the respective terminal portions 16A, which is caused by deformation of the piezoelectric elements supplied with the drive signals and images are formed.

Figure 2:
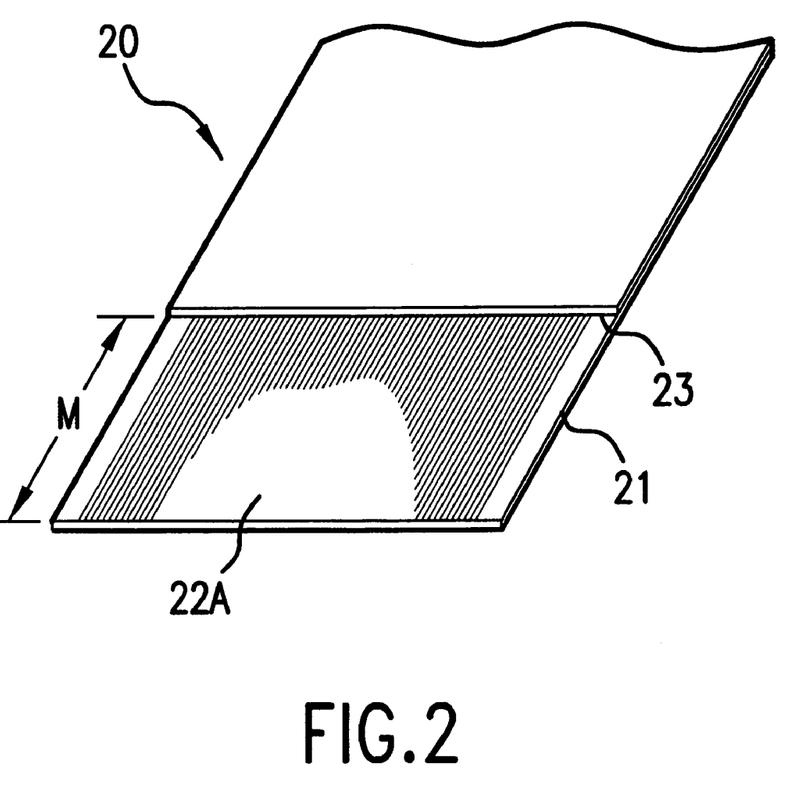
FIG. 2 is a partial perspective view showing an end portion of a flexible printed circuit board.

Next, an explanation will be given of an end, or connection, portion structure (shown as length M in FIG. 3) for connecting leads of a flexible printed circuit board, or flexible electrical connection 20 which is connected to the terminal portions 16A of the plurality of leads 16 formed in the connecting portion 14 with reference to FIGS. 2 and 3.

In the flexible printed circuit board 20, a plurality of leads 22 made of copper are formed on a base film 21, made of material having flexibility and excellent in heat resistance and insulating performance, for example, polyimide resin, at a fine pitch (approximately 0.5 mm) and the plurality of leads 22 are protected by a cover film 23 made of, for example, polyimide resin similar to that of the base film 21.

The end connection portion structure for connecting leads will be explained hereinafter. The cover film 23 is cut off at the end portion 20A, of the flexible printed circuit board 20, having a predetermined length M, and a plurality of end portions 22A of leads 22 are exposed.

Here, the line width of each of the leads 22 is approximately 0.25 mm, its thickness is approximately 18 though 35 μm and the plurality of leads 22 are formed at a fine pitch (for example, approximately 0.5 mm).

Figure 3:
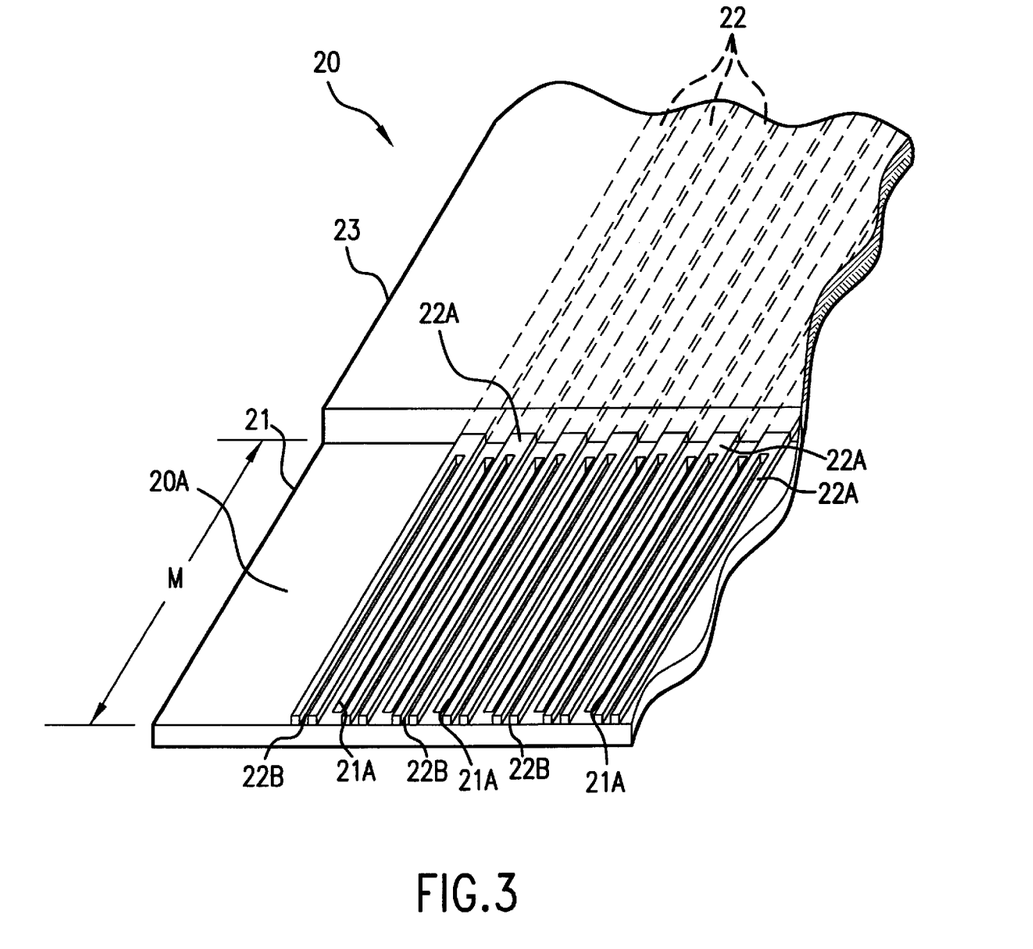
FIG. 3 is an enlarged partial perspective view of the flexible printed circuit board.
Figure 3A:
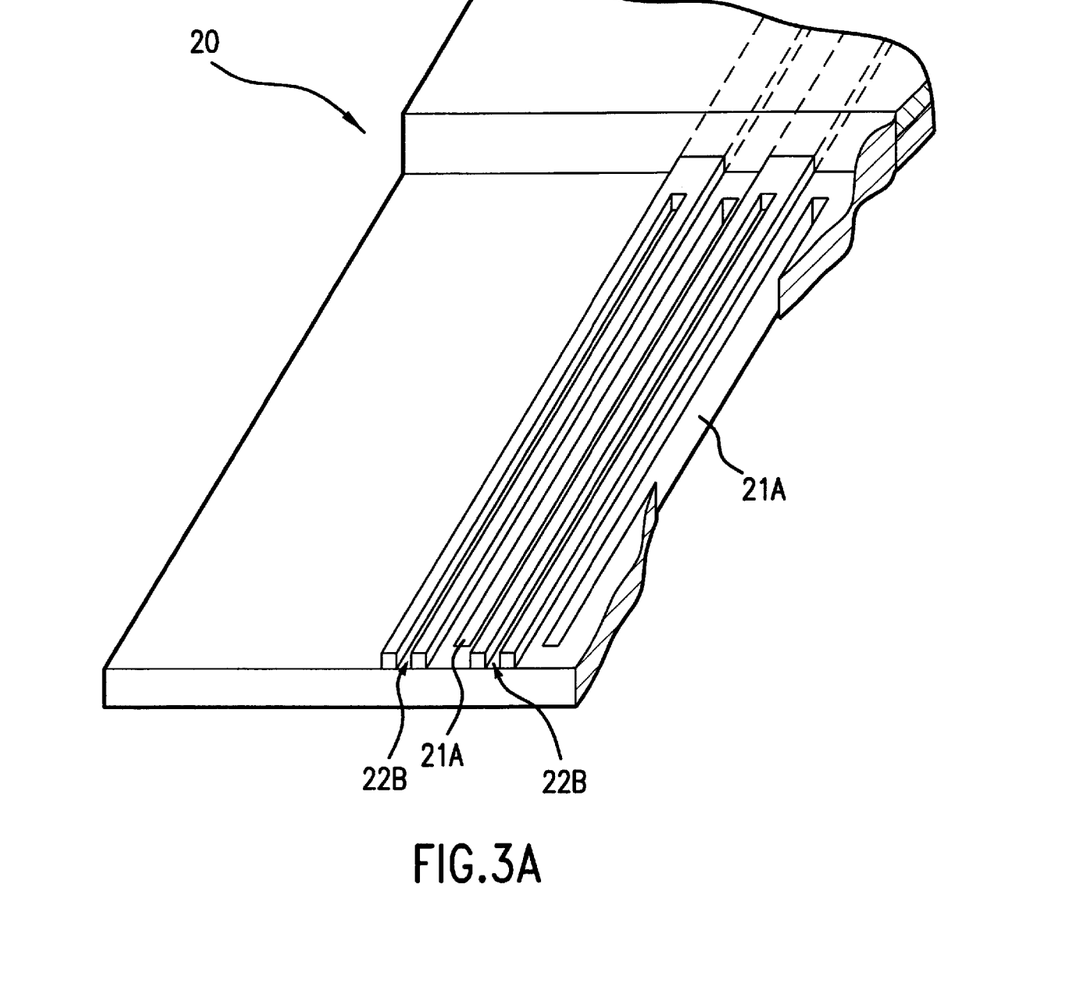

Meanwhile, as shown in FIG. 3, at the end portion of the base film 21, slits 21A for gas evacuation in brazing, for example, soldering, are respectively formed between pairs of the end portions 22A of the plurality of end portions 22A of leads 22, which are approximately equal to the length of portions for soldering, also called brazing portions of the end portions 22A of leads 22. An enlarged view is shown in FIG. 3 and the slits 21A can be seen to be substantially equal to length M (FIG. 3).

Furthermore, slits 22B located at the central portions with respect to the width direction of the end portions 22A of leads 22 for storing molten solder in soldering, are respectively formed in the plurality of the end portions 22A of leads 22, which are approximately equal to the length of the portions for soldering, or brazing portions, of the end portions 22A of leads 22. Further, the respective slits 22B are formed in an opened state at the front portions of the end portions 22A of leads 22, that is, the slits 22B extend along a center or longitudinal axis of the lead such that across a width or an endcross-section, the slit 22B is in the center of the end portion 22A. The slits 21A and 22B may be formed by etching or by laser beam.

Next, an explanation will be given of the operation when the plurality of end, or connection, portions 22A of leads 22 formed on the flexible printed circuit board 20 are soldered to the terminal, or connection, portions 16A, of flexible electrical connection of the plurality of leads 16 formed on the connecting portion 14 of the head main body portion 11.

For soldering, an electrolytically-plated solder 30 is thinly coated on the plurality of end, or connection, portions 22A of leads 22 and flux (so-called resin or rosin), for promoting soldering, is coated thereon. As shown in FIG. 1, the flexible printed circuit board 20 is positioned at and mounted on the terminal, or connection, portions 16A of the plurality of leads 16 formed on the connecting portion 14 of the head main body portion 11 by turning the flexible printed circuit board 20 upside down with the plurality of end portions 22A of leads 22 in the downward direction. Further, the plurality of end portions 22A of leads 22 can be soldered all at once by pressing the base film 21 at the end portion of the flexible printed circuit board 20 from the top side while heating with a heating plate (not shown) at a predetermined temperature, for example, approximately 300° C.

Figure 4:
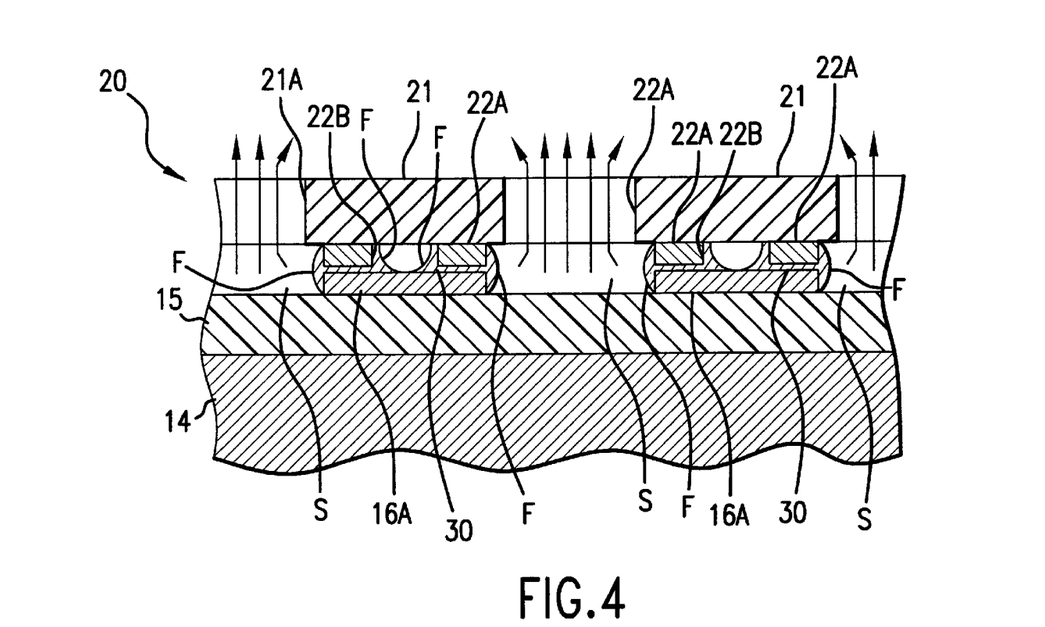
Figure 4A:
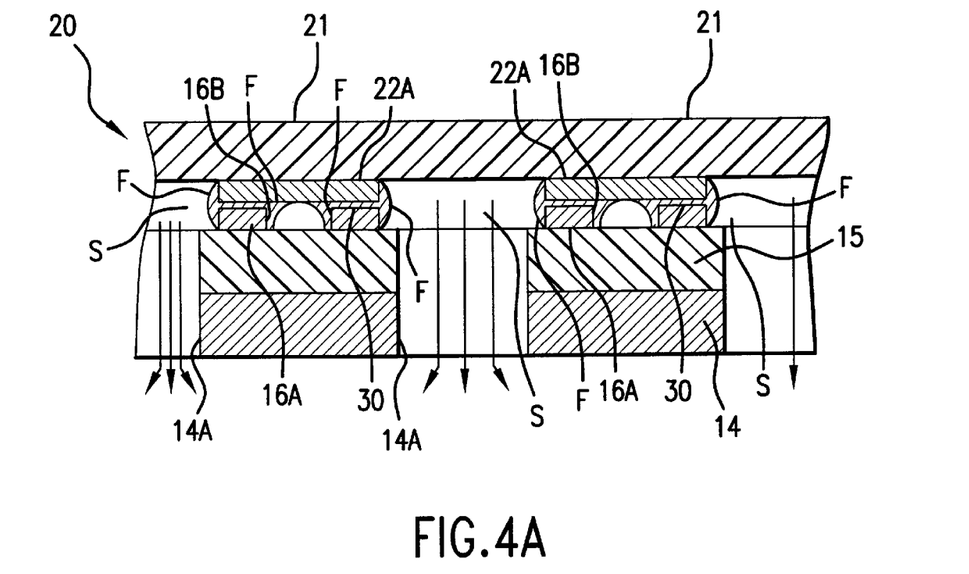
FIG. 4A is a sectional front view taken on line 4—4 in FIG. 1 of an alternative configuration.

During the connecting, as shown in FIG. 4, heat supplied via the base film 21 is transferred to the plated solder 30 via the end portions 22A of leads 22, the plated solder 30 and the flux are simultaneously heated and melted. Since the flux comprises resin dissolved in alcohol, the gasses generated from the resin and the alcohol are explosively evaporated instantaneously when the flux is heated to the high temperatures, for example, approximately 300° C.

Meanwhile, the thickness of the end portions 22A of leads 22 is as thin as approximately 18 through 35 μm and the fine pitch between the leads is as small as approximately 0.5 mm. Accordingly, a connecting portion space S surrounded by two lead connecting portions in which the end portions 22A of leads 22 and the terminal portions 16A overlap and by the two base films 15 and 21 is very small. However, the gas generated in the explosive evaporation of the alcohol or the gases generated from the resin are efficiently evacuated to the atmosphere all at once from the very small connecting portion spaces S via the slits 21A, in base film 21, and at the same time evacuated to the atmosphere from the front end portions of the slits 22B.

Figure 1A:
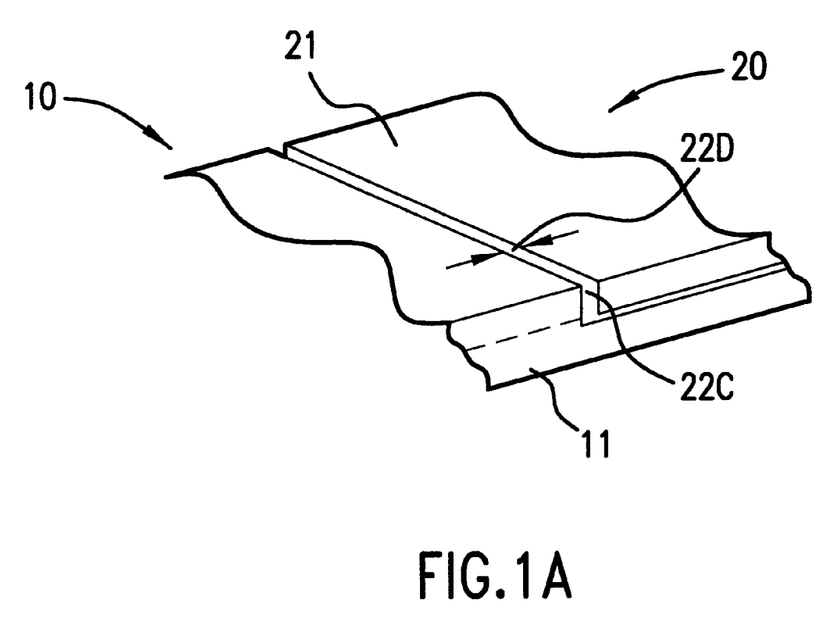
FIG. 1A is a blow up or an expanded portion of FIG. 1 to better show the gap at the junction between the recording head unit and the flexible printed circuit board.

Accordingly, the gasses generated in soldering are efficiently and easily discharged to the atmosphere via the respective slits 21A, 22B. In the case of slits 22B, the gases escape through the gap 22D at the junction 22C (FIGS. 1 and 1A) of the head main body portion 11 and the flexible printed circuit board 20. In addition, the plated solder 30 melted to a boiling state by heating flows mainly into the slits 22B and at the same time projects to the external sides of the end portions 22A of leads 22 though the amount is small thereby forming fillets F. As a result, the connection strength by soldering is promoted by the fillets F, including the fillets F formed at the both sides of the slits 22B. Thus, soldering failure is prevented by eliminating the scattering of the plated solder 30 with the resultant degradation in insulating performance among the leads since solder bridges or balls are not formed.

In this way, the slits 21A for gas evacuation in soldering are formed between pairs of the end portions of the plurality of end portions 22A of leads 22 at the end portion of the base film 21, which are formed approximately equal to the length of the portions for soldering, also called brazing portions. Therefore, the gasses generated in soldering are efficiently discharged all at once to the atmosphere via the slits 21A. Accordingly, the plated solder 30, melted by heating, does not scatter and when the end portions 22A of leads 22 of the flexible printed circuit board 20 are connected to the terminal portions 16A of the plurality of leads 16 formed at the connecting portion of the head main body portion 11 by soldering, soldering failure is prevented and the insulating performance among the leads is improved.

Figure 5:
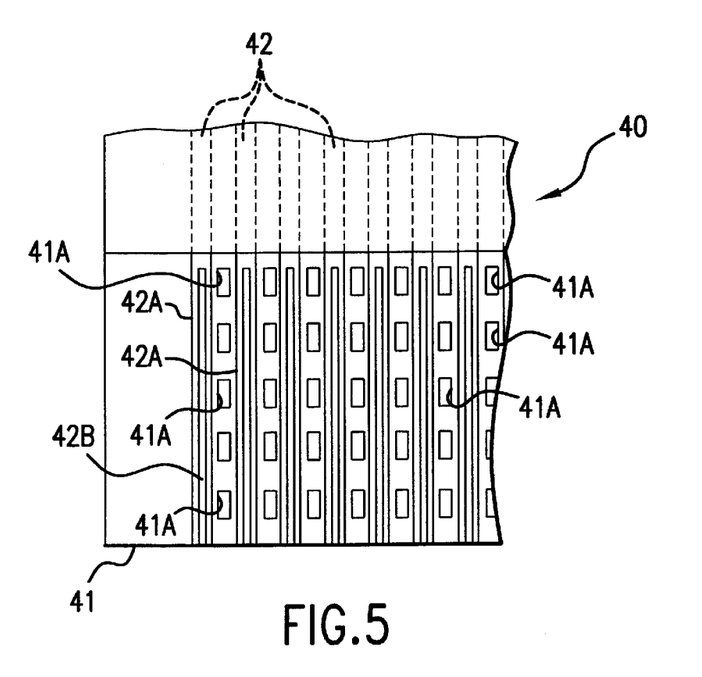
FIG. 5 is an enlarged partial plane view of a flexible printed circuit board according to a modified embodiment.
Figure 5A:
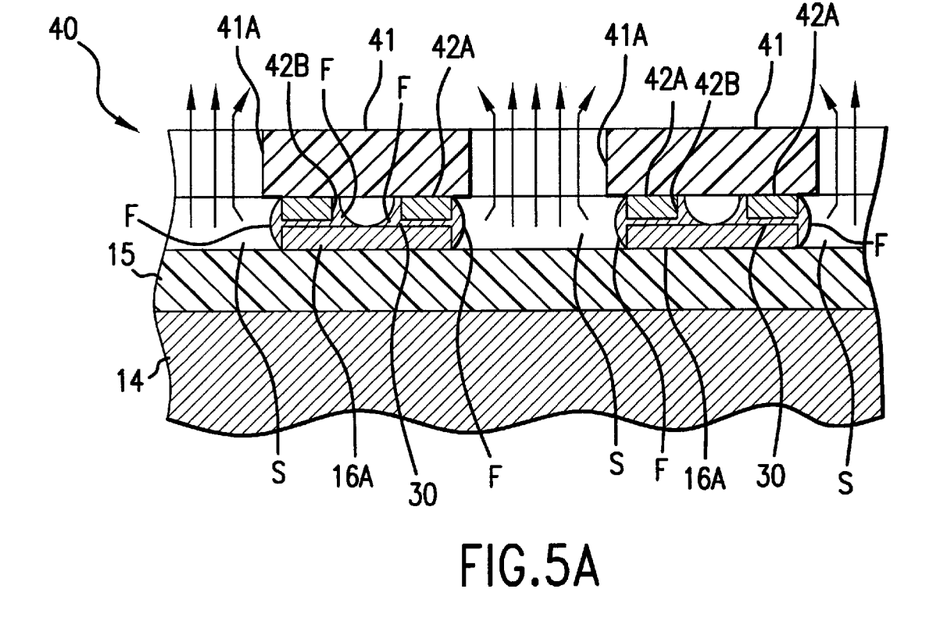
FIG. 5A is a sectional front view taken on line 4—4 of FIG. 1 and showing the modified embodiment of the flexible printed circuit board of FIG. 5.

Alternatively, the slits 22B found in end portions 22A could be proved as slits 16B in the terminal portion 16A of the leads 16 of the connecting portion 14 of the head main body portion 11 (FIGS. 4A and 7–10A). Meanwhile, it is possible to constitute an end portion structure for connecting leads as shown by FIGS. 5 and 5A by partially modifying the end portion structure for connecting leads of a flexible printed circuit board 40.

That is, slits for gas evacuation comprising a plurality of slits 41A, each having a very small length, are formed in a row between pairs of end portions 42A of leads 42. The gap between each pair of end portion 42A is a slit 42B. In this case not only gases generated in soldering are easily discharged to the atmosphere via the respective slits 41A but the tensile strength of the end portions for connecting the leads 42 can be promoted.

Further, various modifications may be made to the above-mentioned embodiments based on existing technology or technologies obvious to a skilled person, which are exemplified as follows.

When the line width or the pitch of the plurality of leads 22 or 42 formed on the base film 21 or 41 of the flexible printed circuit board 20 or 40, is as large as 1.5 through 2.0 mm, for example, two rows or three rows of slits for gas evacuation may be provided. Pluralities of slits, the length of which is approximately equal to the length of the portions for soldering, and slits each comprising a plurality of slits each having a very small length, may alternatingly be provided. The slits 22B may not be provided at the end portions 22A of leads 22. The slits may be formed by cutting the base film 21 or 41. The slits may be opened by gas pressure. The slits 14A (FIGS. 4A and 7–10A) may be formed at the connecting portion 14 of the head main body portion 11. Further, the invention is naturally applicable to end portion structures for connecting leads of various flexible printed circuit boards connected to a plurality of terminal portions of electronic parts by various kinds of brazing other than soldering.

Additionally, if the electronic part structure is such, the slits can be provided in the electronic part extending through the support structure, such as through the base film 15 and connecting portion 14, or in the terminal portions 16A (FIG. 4) rather than in the flexible printed circuit board.

What is claimed is:

1. An apparatus including a flexible printed circuit board and an electronic part, the flexible printed circuit board and the electronic part each having a connection portion whereby the flexible printed circuit board and the electronic part are connected by brazing, the flexible circuit board comprising:
    a printed circuit;
    a base film having the printed circuit thereon;
    a plurality of leads having end portions extending from the flexible printed circuit board and formed on a portion of the base film at the connection portion of the flexible printed circuit board at a predetermined pitch;
    a cover film covering a predetermined section of the plurality of leads on the base film, and
    the collection portion of the electronic part comprising a plurality of leads, each of the plurality of leads having a width, a length and a thickness, wherein at least one slit is respectively formed in at least one of the plurality of leads formed on the base film of the flexible circuit board, the plurality of leads of the electronic part on the connection portion, in the base film of the flexible circuit board along each lead of the plurality of leads, and in the electronic part along each lead of the plurality of leads on the connection portion.

2. The apparatus as claimed in claim 1, wherein the at least one slit is formed approximately equal to a length of a predetermined portion for brazing of each of the plurality of leads.

3. The apparatus as claimed in claim 1, wherein the at least one slit opens to a gap at a junction of the electronic part and the flexible printed circuit board.

4. The apparatus as claimed in claim 1, wherein the at least one slit is centrally located in a width direction of each of the plurality of leads on the base film.

5. The apparatus as claimed in claim 1, wherein the electronic part is a recording head of an ink jet printer.

6. An apparatus comprising:
    an electronic part; and
    a flexible electrical connector joined to the electronic part by brazing, wherein the flexible electrical connector has a base film, a plurality of leads on the base film and a cover over the plurality of leads except for a connection portion and the electronic part has a base, a plurality of leads on the base, and a cover over the plurality of leads except at a connection portion, the connection portion of the flexible electrical connector overlaid on the connection portion of the electronic part forming an overlaid area with the plurality of leads on the base film contacting the plurality of leads on the base in a paired lead configuration, each pair of leads joined by brazing, the overlaid area comprising at least one of a slit cut in the base film between adjacent leads of the flexible electrical connector, a slit cut in the base between adjacent leads of the electronic part, a slit in an end of each lead in the connection portion of the flexible electrical connector, and a slit in an end of each lead in the connection portion of the electronic part.

7. The apparatus as claimed in claim 6, wherein the slits formed in either one of the base film and the base are approximately as long as the connection portion.

8. The apparatus as claimed in claim 6, wherein the slits formed in one of the base file and the base are a series of aligned slits extending a length of the connection portion.

9. The apparatus as claimed in claim 6, wherein the slits formed in one of the base film and the base are a series of aligned groups of slits having at least two side by side slits in each group, the series of aligned groups of slits extending a length of the connection portion.

10. The apparatus as claimed in claim 6, wherein the slits formed in each lead of one of the plurality of leads on the base film and the plurality of leads formed on the base extend substantially the length of the overlaid connection portion of the flexible electrical connector and the connection portion of the electronic part and are open at an end away from where the plurality of leads are covered on both sides.

11. The apparatus as claimed in claim 10, wherein an end of the connection portion of the flexible electrical connector is offset from the cover of the electronic part and an end of the connection portion of the electronic part is offset from the cover of the flexible electrical connector.

* * * * *